(12) United States Patent
Nagarasa et al.

(10) Patent No.: US 6,907,539 B1
(45) Date of Patent: Jun. 14, 2005

(54) CONFIGURAGE DATA SETUP/HOLD TIMING CIRCUIT WITH USER PROGRAMMABLE DELAY

(75) Inventors: Padma S. Nagarasa, Milpitas, CA (US); Pidugu L. Narayana, Sunnyvale, CA (US); Beng-Ghee Teh, San Jose, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 428 days.

(21) Appl. No.: 09/592,207

(22) Filed: Jun. 13, 2000

(51) Int. Cl.$^7$ .............................................. H04L 7/00
(52) U.S. Cl. ...................... 713/401; 327/277; 327/284
(58) Field of Search ................................ 327/277, 284; 713/401

(56) References Cited

U.S. PATENT DOCUMENTS

| | | | |
|---|---|---|---|
| 5,247,617 A | * | 9/1993 | Olson ........................... 710/46 |
| 5,670,904 A | * | 9/1997 | Moloney et al. ............. 327/277 |
| 6,150,863 A | * | 11/2000 | Conn et al. .................. 327/270 |
| 6,310,506 B1 | * | 10/2001 | Brown ......................... 327/284 |

FOREIGN PATENT DOCUMENTS

JP 63177610 A * 7/1988 ............ H03K/5/13

OTHER PUBLICATIONS

Dallas Semiconductor Datasheet, "DS1020 Programmable 8–Bit Silicon Delay Line", Nov. 17, 1999.*

IBM Technical Disclosure Bulletin; "Programmable Delay Line Control Signal Circuits", vol. 37, No. 8, pp. 519–520, Aug. 1994.*

JEDEC Standard No. 8–6, "High Speed Transceiver Logic (HSTL)—A1.5 V Output Buffer Supply Voltage Based Interface Standard for Digital Integrated Circuits", EIA/JESD8–6, Aug. 1995.*

* cited by examiner

Primary Examiner—Thomas Lee
Assistant Examiner—Albert Wang
(74) Attorney, Agent, or Firm—Christopher P. Maiorana, PC

(57) ABSTRACT

An apparatus comprising a first delay circuit. The first delay circuit may be configured to present a data delayed signal having one of a plurality of delay times. The plurality of delay times may provide a user configurable setup/hold time.

22 Claims, 4 Drawing Sheets

CONFIGURAGE DATA SETUP/HOLD TIMING CIRCUIT WITH USER PROGRAMMABLE DELAY

FIELD OF THE INVENTION

The present invention relates to a method and architecture for configuring a data setup/hold time generally and, more particularly, to a method and architecture for implementing a configurable data setup/hold timing circuit.

BACKGROUND OF THE INVENTION

Conventional data setup/hold timing circuits provide non-variable data setup/hold timing. Data setup is defined as the time the data should be present at an input before a clock signal arrives. Data hold is defined as the time the data should be held at the input after the clock signal arrives.

Referring to FIG. 1, a conventional circuit 10 requiring an aggressive data setup time is shown. The circuit 10 comprises a first circuit, such as an application specific integrated circuit (ASIC) 12 and a second circuit, such as a first-in first-out FIFO 14. A clock signal CLK is presented to an input 16 of the ASIC 12 and to an input 18 of the FIFO 14. The ASIC 12 presents a data signal DATA to the FIFO 14 in response to the system clock CLK. The FIFO 14 requires an aggressive setup time since both the ASIC 12 and the FIFO 14 are driven by the system clock CLK.

Referring to FIG. 2, a conventional circuit 20 requiring an aggressive data hold time is shown. The circuit 20 comprises a logic block 22 and a FIFO 24. The logic block 22 receives a data signal DATA. Additionally, the logic block 22 presents the data signal DATA and a clock CLK to the FIFO 24. The FIFO 24 requires an aggressive hold time, because the clock CLK and the data presented to the FIFO 24 are serially connected between the logic block 22 and the FIFO 24.

The conventional FIFOs 14 and 24 have non-optimal data setup/hold timing. The conventional FIFOs 14 and 24 are limited, since they introduce performance degradation.

SUMMARY OF THE INVENTION

The present invention concerns an apparatus comprising a first delay circuit. The first delay circuit may be configured to present a data delayed signal having one of a plurality of delay times. The plurality of delay times may provide a user configurable setup/hold time.

The objects, features and advantages of the present invention include providing a method and/or architecture for implementing a configurable data setup/hold time that may (i) provide an optimal data setup time, (ii) provide an optimal data hold time, (iii) reduce performance degradation and/or (iv) provide user configurable delay parameters.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 3:
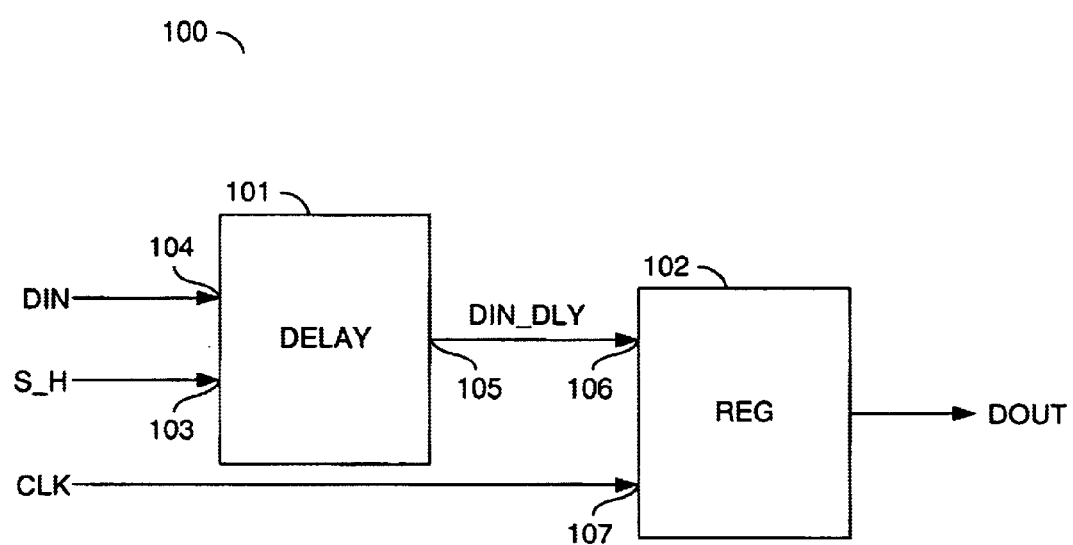
FIG. 3 is a block diagram of a preferred embodiment of the present invention.

Referring to FIG. 3, a block diagram of circuit 100 is shown in accordance with a preferred embodiment of the present invention. The structure of the circuit 100 generally comprises a delay block (or circuit) 101 and a register block (or circuit) 102. The circuit 100 may be implemented, in one example, as a configurable data setup/hold timing circuit. In another example, the circuit 100 may be implemented as a configurable register timing circuit. The circuit 100 may provide an optimal balance data setup/hold time that may be adjusted for various operational implementations. The circuit 100 may reduce performance degradation as a result of data setup and/or hold times. Additionally, the circuit 100 may be user configurable.

The delay circuit 101 may have an input 103 that may receive a signal (e.g., S_H), an input 104 that may receive a signal (e.g., DIN) and an output 105 that may present a signal (e.g., DIN_DLY). The signal DIN_DLY may be presented to an input 106 of the register 102. The register 102 may also have an input 107 that may receive a signal (e.g., CLK). The register 102 may be configured to store the signal DIN_DLY in response to the signal CLK. The register 102 may present a signal (e.g., DOUT). In one example, the signal S_H may be implemented as a setup and hold time configuration signal and the signal DIN_DLY may be implemented as a delayed data signal. In another example, the signal S_H may be implemented as a user configurable signal. For example, the signal S_H may be configured/programmed in a number of ways such as (i) a control interface, (ii) a number of input pins, (iii) software instructions, and/or (iv) hardware. However, the signal S_H and the signal DIN_DLY may be implemented as other appropriate signal types in order to meet the criteria of a particular implementation.

Figure 4:
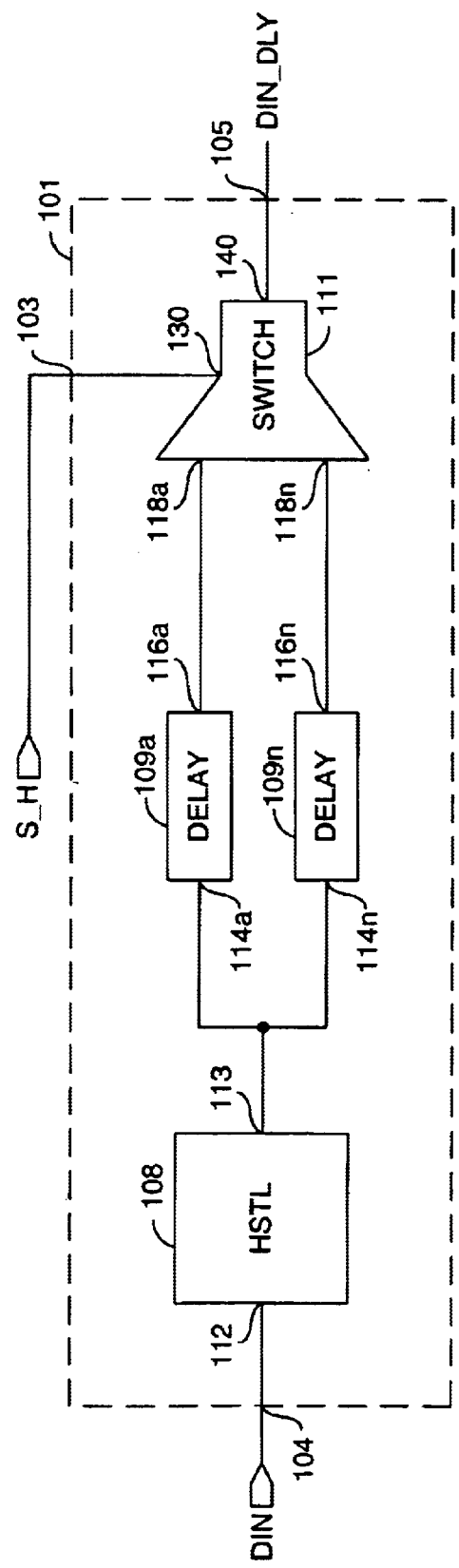
FIG. 4 is a detailed block diagram of a delay block of FIG. 3.

Referring to FIG. 4, a detailed block diagram of the delay circuit 101 is shown. The delay circuit 101 may be implemented, in one example, within a JTAG port. The delay circuit 101 may comprise a high speed transceiver logic (HSTL) block (or circuit) 108, a plurality of delay blocks (or circuits) 109a–109n, and a switch 111. The HSTL circuit 108 may be compliant with the JEDEC specification for input/output interfaces, which is hereby incorporated by reference in its entirety. The HSTL circuit 108 may be programmed to implement a variety of common applications. For example, the HSTL circuit 108 may be programmed to control data input to the delay blocks 109a–109n. HSTL is the JEDEC standard for input/output interfaces in low voltage designs (e.g., 2.5V and under). Since the voltage swings on HSTL inputs and outputs are much smaller (e.g., 0–1.5V range with rise and fall times of 0.5 ns (edge rates of 2 v/ns)), appropriate setup/hold timing is important. However, the present invention is applicable to other technologies, such as TTL, CMOS, etc.

The HSTL circuit 108 may have an input 112 that may receive the signal DIN. The signal DIN may be implemented, in one example, as an externally generated data input signal. The HSTL circuit 108 may have an output 113 that may present a signal to an input 114a of the delay circuit 109a and to an input 114n of the delay circuit 109n. The particular number of delay blocks 109a–109n may be varied to meet the criteria of a particular implementation. For example, by implementing more delay blocks

109a–109n, a larger number of programmable delay choices may be implemented.

The delay circuits 109a–109n may each have an output 116a–116n that may present a signal to an input 118a–118n of the switch 111. The switch 111 may have an input 130 that may receive the signal S_H. In one example, the signal S_H may be implemented as a multi-bit setup and hold configuration signal. In one example, the signal S_H may be either a high state (e.g., "1") or a low state (e.g., "0").

The various signals are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

The switch 111 may select at least one of the outputs of the delay circuits 109a–109n. The switch 111 may select the appropriate delay circuit 109a–109n in response to the signal S_H. The signal S_H may be implemented to provide any appropriate delay in order to meet the criteria of a particular implementation. Additionally, the signal S_H may be generated by any appropriate a type device and/or configuration in order to meet the criteria of a particular implementation. The switch 111 may have an output 140 that may present the signal DIN_DLY. The switch 111 may allow the circuit 100 to provide an optimal data setup-hold window. Additionally, the switch 111 may allow the user to select an appropriate delay parameter. The signal DIN_DLY may be implemented, in one example, as a delayed data signal.

Referring to FIG. 3 in conjunction with FIG. 4, the circuit 100 generally starts operation when the signal is presented to the delay block 101. The delay block 101 may provide a data delay (e.g., the signal DIN_DLY) of the input data DIN. The register 102 may receive the delayed data signal DIN_DLY. Additionally, the register 102 may present the signal DOUT in response to the clock CLK. A particular delay length of the signal DIN may be determined in response to the signal S_H. The switch 111 may determine which delay circuit 109a–109n to select in response to the signal S_H. The signal S_H may be implemented, in one example, as a user configuration setup and hold timing signal. In another example, the signal S_H may be implemented as a multi-bit signal. The delay circuits 109a–109n may each be implemented with a different delay length. The data input DIN may be delayed according to a selection of an appropriate delay (e.g., the delay circuits 109a–109n).

Figure 5:
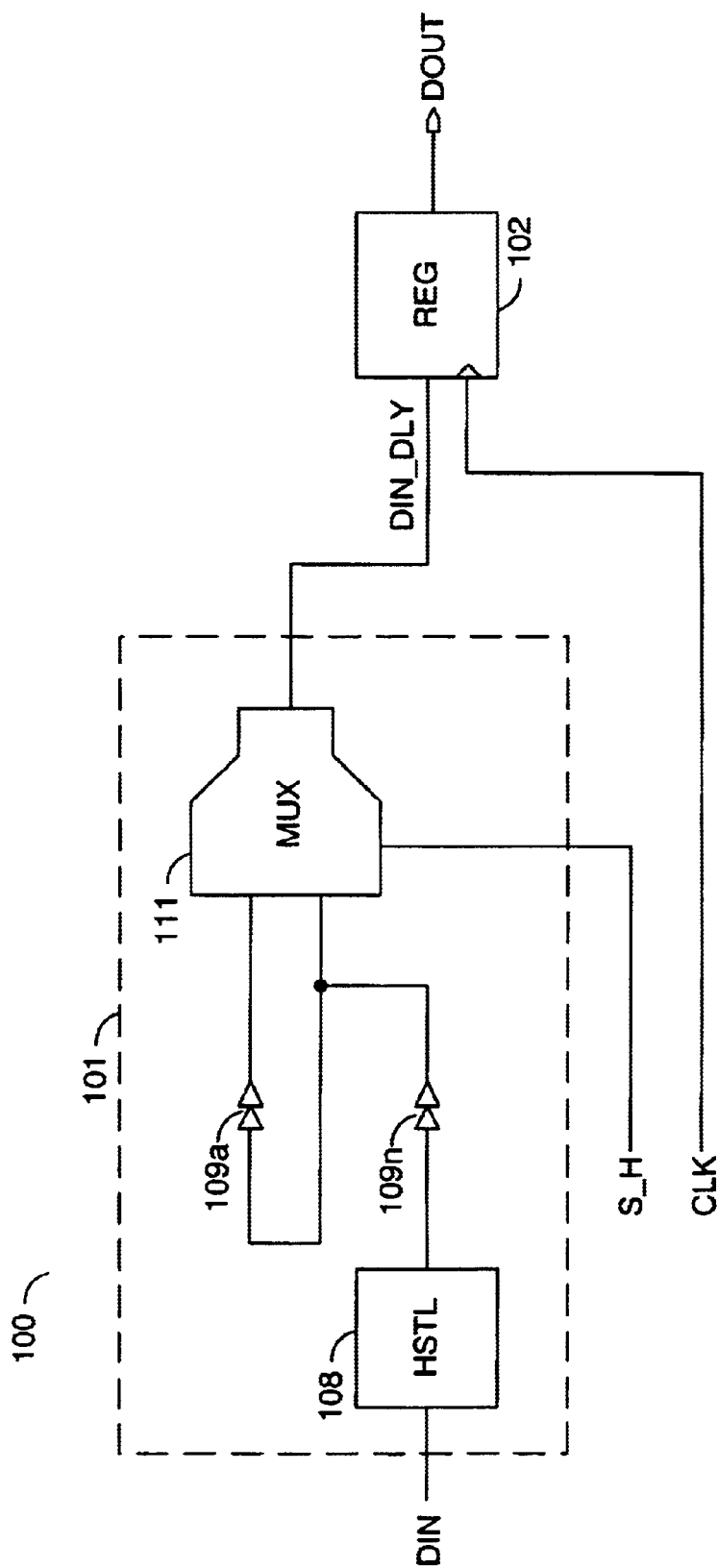
FIG. 5 is a more detailed block diagram of the present invention.

Referring to FIG. 5, a detailed block diagram of the circuit 100 is shown. The circuit 100 of FIG. 5 illustrates an overall detailed implementation of the present invention. The circuit 101 may comprise the HSTL block 108, the delay devices 109a–109n and the multiplexer 111. The register 102 may be implemented, in one example, as a "D" type register. However, the register 102 may be implemented as another appropriate type register in order to meet the criteria of a particular implementation.

The circuit 100 may provide optimal setup and hold timing solutions. The circuit 100 may provide a configurable delay for (i) data and/or (ii) clock signals. The circuit 100 may overcome performance degradation associated with a single timing setup. The circuit 100 may provide reduced performance degradation of data setup and/or hold times. Additionally, the circuit 100 may provide a user configurable delay.

Figure 1:
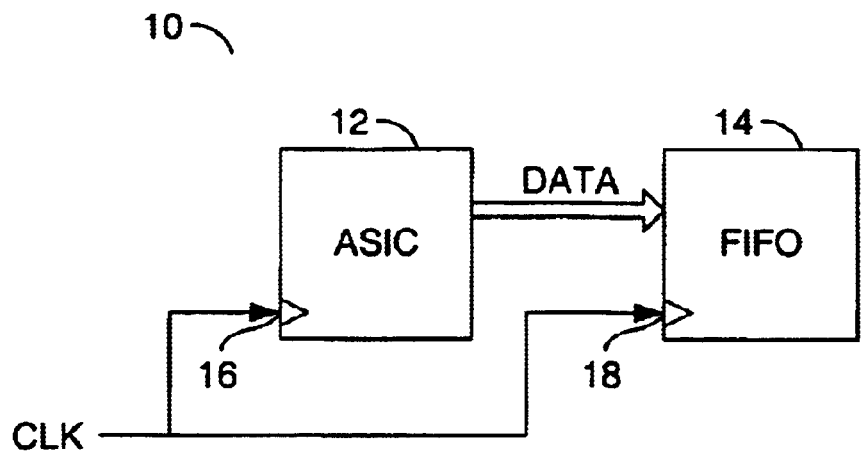
FIG. 1 is a block diagram of a conventional timing circuit illustrating an aggressive data setup time.
Figure 2:
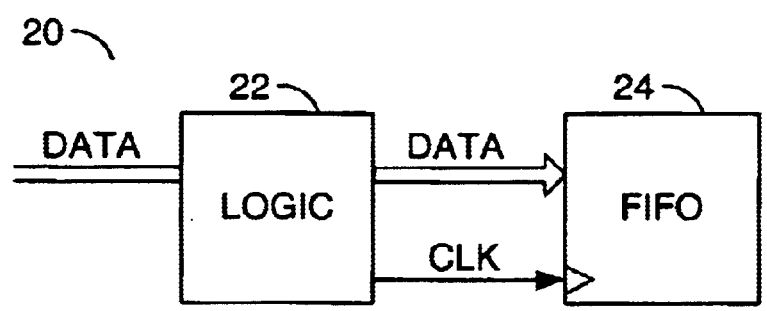
FIG. 2 is a block diagram of a conventional timing circuit illustrating an aggressive data hold time.

The circuit 100 has been described in the context of the example of two delay elements. However, a number of delay elements may be implemented accordingly to meet the design criteria of a particular implementation. For example, a plurality of delay elements 109a–109n may be implemented to provide a variety of programmable delay times for the signal DIN_DLY. In general, particular design parameters may dictate that a fast or a slow delay time of the signal DIN_DLY may be required. For example, one of the delay elements 109a–109n may be appropriate to provide timing that may be used with a circuit such as the circuit 10 of FIG. 1. Furthermore, another one of the delay elements 109a–109n may provide a delay of the signal DIN_DLY appropriate with a circuit such as the circuit 20 of FIG. 2. Furthermore, another of the delay elements 109a–109n may be programmed to provide a delay appropriate for another design application. When the number of delay elements is greater than two, the signal S_H may be implemented as a multi-bit signal. In one example, the signal S_H may be received from an external pin. However, the signal S_H may be received from other sources, such as an internal register, control interface, software instructions, a microprocessor, etc.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a first input configured to receive a clock signal;
   a second input configured to receive a data signal having a first setup/hold window with respect to a transition of said clock signal;
   a first circuit configured to (i) receive said data signal from said second input and (ii) present a delayed data signal having a second setup/hold window with respect to said transition of said clock signal, wherein (i) a difference between said first setup/hold window and said second setup/hold window is configured in response to one or more of a plurality of delay times, (ii) each of said plurality of delay times is less than a period of said clock signal and (iii) said plurality of delay times provides a user configurable delay of said second setup/hold window relative to said transition of said clock signal; and
   a second circuit configured to receive said delayed data signal from said first circuit and said clock signal from said first input.

2. The apparatus according to claim 1, wherein:
   said second circuit is configured to present a data output in response to said delayed data signal and said clock signal.

3. The apparatus according to claim 2, wherein said second circuit comprises a register that is further configured to store said delayed data signal in response to said clock signal.

4. The apparatus according to claim 1, wherein said first circuit further comprises a high speed transceiver logic (HSTL) circuit configured to present a first signal in response to said data signal.

5. The apparatus according to claim 4, wherein said first circuit further comprises one or more delay circuits each configured to present an output delay signal in response to said first signal.

6. The apparatus according to claim 5, wherein said first circuit further comprises a switch configured to receive said one or more output delay signals and present said delayed data signal.

7. The apparatus according to claim 6, wherein said switch is further configured in response to a user configuration signal.

8. The apparatus according to claim 7, wherein said user configuration signal comprises a setup and hold timing configuration signal.

9. The apparatus according to claim 7, wherein said user configuration signal comprises a programmable signal.

10. The apparatus according to claim 7, wherein said user configuration signal comprises a multi-bit signal.

11. The apparatus according to claim 1, wherein a total of all of said plurality of delay times is less than said period of said clock signal.

12. The apparatus according to claim 1, further comprising a first-in-first-out (FIFO) memory.

13. The apparatus according to claim 1, wherein said data signal and said clock signal are externally generated.

14. An apparatus comprising:
   means for receiving (i) a clock signal and (ii) a data signal having a first setup/hold window with respect to a transition of said clock signal;
   means for presenting a delayed data signal having a second setup/hold window with respect to said transition of said clock signal in response to said data signal, wherein (i) a difference between said first setup/hold window and said second setup/hold window is configured in response to one or more of a plurality of delay times, (ii) each of said plurality of delay times is less than a period of said clock signal and (iii) said plurality of delay times provides a user configurable delay of said second setup/hold window relative to said transition of said clock signal; and
   means for storing said delayed data signal in response to said clock signal.

15. A method for programming a setup/hold window, comprising the steps of:
   (A) receiving (i) a clock signal and (ii) a data signal having a first setup/hold window with respect to a transition of said clock signal; and
   (B) presenting (i) a delayed data signal (a) having a second setup/hold window with respect to said transition of said clock signal and (b) generated in response to said data signal to a first input of a circuit and (ii) said clock signal to a second input of said circuit, wherein (i) a difference between said first setup/hold window and said second setup/hold window is configured in response to one or more of a plurality of delay times, (ii) each of said plurality of delay times is less than a period of said clock signal and (iii) said plurality of delay times provides a user configurable delay of said second setup/hold window relative to said transition of said clock signal.

16. The method according to claim 15, further comprising the steps of:
   (C) storing said delayed data signal and presenting a data output signal in response to said clock signal.

17. The method according to claim 15, wherein step (B) further comprises presenting a first signal in response to said data signal.

18. The method according to claim 17, wherein step (B) further comprises presenting one or more output delay signals in response to said first signal.

19. The method according to claim 18, wherein step (B) further comprises receiving said one or more output delay signals and presenting said delayed data signal.

20. The method according to claim 19, wherein step (B) further comprises switching said one or more output delay signals in response to a user configuration signal.

21. The method according to claim 20, wherein said user configuration signal comprises one or more of (i) a setup and hold timing configuration signal and (ii) a multi-bit signal.

22. The method according to claim 20, wherein said user configuration signal comprises a programmable signal.

* * * * *